US010251309B1

(12) United States Patent
Markovich (10) Patent No.: US 10,251,309 B1
(45) Date of Patent: Apr. 2, 2019

(54) SYSTEMS AND METHODS FOR PASSIVE COOLING OF ELECTRICAL MODULES WITHIN ELECTRICAL UNITS (71) Applicant: General Electric Company, Schenectady, NY (US)

(72) Inventor: Igor Markovich, Vancouver (CA)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 15/950,793

(22) Filed: Apr. 11, 2018

(51) Int. Cl.
G06F 1/16 (2006.01)
H05K 5/00 (2006.01)
H05K 7/00 (2006.01)
H05K 7/20 (2006.01)
H05K 7/14 (2006.01)

(52) U.S. Cl.
CPC ............. H05K 7/2039 (2013.01); H05K 7/14 (2013.01)

(58) Field of Classification Search
CPC ............ G06F 1/20; G06F 1/203; G06F 1/206; H05K 7/14; H05K 7/2039; H05K 7/20409; H05K 7/20418
USPC ....... 361/715, 714, 709, 707, 704, 703, 702, 361/689, 688
See application file for complete search history.

(56) References Cited

U.S. PATENT DOCUMENTS

| 6,665,184 | B2 * | 12/2003 | Akselband | F28F 3/12 165/104.33 |
| 7,751,192 | B2 * | 7/2010 | Abul-Haj | F28F 3/02 165/185 |
| 7,974,093 | B2 | 7/2011 | Zeng et al. | |
| 8,009,429 | B1 | 8/2011 | Sundstrom et al. | |
| 9,125,299 | B2 | 9/2015 | Wittenberg et al. | |
| 9,521,782 | B2 | 12/2016 | Tatta et al. | |
| 9,781,863 | B1 | 10/2017 | Kim | |
| 2012/0170224 | A1 * | 7/2012 | Fowler | H05K 7/1424 361/720 |
| 2013/0077254 | A1 * | 3/2013 | Nguyen | G02B 6/4261 361/715 |
| 2015/0144319 | A1 * | 5/2015 | Natali | B22D 19/0063 165/185 |
| 2017/0083060 | A1 | 3/2017 | Nicol et al. | |
| 2017/0188448 | A1 | 6/2017 | Liang et al. | |
| 2018/0049348 | A1 * | 2/2018 | Bucher | H05K 7/20445 |
| 2018/0070436 | A1 | 3/2018 | Feichtinger et al. | |

* cited by examiner

*Primary Examiner* — Anthony M Haughton
(74) *Attorney, Agent, or Firm* — Armstrong Teasdale LLP (57) ABSTRACT

An electrical communications apparatus includes a support structure having a support heat transfer member. An electrical unit is received within the support structure. The electrical unit includes a module side defining a bore therethrough. The module side is arranged to receive an electrical module within the bore. The electrical unit further includes a conduction side adjacent the module side and a unit heat transfer member coupled to the conduction side. The unit heat transfer member and the support heat transfer member are correspondingly tapered to facilitate slidably coupling the unit heat transfer member and the support heat transfer member.

20 Claims, 8 Drawing Sheets

SYSTEMS AND METHODS FOR PASSIVE COOLING OF ELECTRICAL MODULES WITHIN ELECTRICAL UNITS

BACKGROUND

The present application relates generally to cooling electrical communications apparatuses and, more particularly, to structures for the passive cooling of electrical components disposed within electrical communications apparatuses.

Electrical components disposed within electrical and/or electro-mechanical systems, such as industrial communications systems, generate large amounts of heat. Such systems may be organized into a wide variety of electrical enclosures (e.g., electrical cabinets, electrical racks, etc.) that have a limited amount of space for the electrical components disposed therein. Indeed, the components disposed within these electrical enclosures may be densely packed within the limited amount of space, thereby leading to various thermal effects, such as the thermal degradation of the electrical components.

Accordingly, various heat dissipation techniques may be utilized within the electrical enclosures to help reduce the thermal effects on the electrical components. In some situations, active techniques related to air-cooling and/or water-cooling may be utilized to dissipate heat within these electrical systems. However, such techniques involve additional components, such as fans, filters, etc., that may increase the manufacturing cost, increase maintenance costs, occupy portions of the limited amount of space, and/or reduce the operating efficiency of the electrical systems. In addition, active cooling techniques, such as air-cooling and water-cooling techniques, generally often make use of moving components, such as bearing assemblies and rotors. As a result, such active cooling techniques may have higher rates of failure as compared to some passive cooling techniques. In particular, cooling techniques relying on air circulation within electrical enclosures are especially poorly suited for mission critical environments, such as power grid substations, where failure of active cooling systems can result in performance degradation or outages of electrical components. Further some electrical components, and in particular, small form factor pluggable devices, are manufactured in accordance with design parameters established by standard setting organizations. Moreover, such electrical components are designed to be removably pluggable and thus cannot be fixedly attached to traditional convection cooling apparatuses, such as, for example, a heat sink.

BRIEF DESCRIPTION

In one aspect, an electrical communications apparatus is provided. The electrical communications apparatus includes a support structure having a support heat transfer member. An electrical unit is received within the support structure. The electrical unit includes a module side defining a bore therethrough and arranged to receive an electrical module within the bore. The electrical unit further includes a conduction side adjacent the module side and a unit heat transfer member coupled to the conduction side. The unit heat transfer member and the support heat transfer member are correspondingly tapered to facilitate slidably coupling the unit heat transfer member and the support heat transfer member.

In another aspect, an electrical unit for use in an electrical communications apparatus is provided. The electrical unit includes a module side defining a bore therethrough and arranged to receive an electrical module within the bore. The electrical unit further includes a conduction side adjacent the module side and a unit heat transfer member coupled to the conduction side. The unit heat transfer member is tapered to facilitate slidably coupling the unit heat transfer member to a correspondingly tapered support heat transfer member of the electrical communications apparatus.

In yet another aspect, a method of using an electrical communications apparatus is provided. The method includes inserting an electrical unit into a support structure, the support structure including a support heat transfer member. The method further includes electrically coupling the electrical unit to a carrier. The electrical unit includes a module side defining a bore therethrough and arranged to receive an electrical module within the bore. The electrical unit further includes a conduction side adjacent the module side and a unit heat transfer member coupled to the conduction side. The unit heat transfer member and the support heat transfer member are correspondingly tapered to facilitate slidably coupling the unit heat transfer member and the support heat transfer member.

Although specific features of various embodiments may be shown in some drawings and not in others, this is for convenience only. Any feature of any drawing may be referenced and/or claimed in combination with any feature of any other drawing.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Specifically, as used herein, the terms "substantially transverse" or "substantially parallel" should be interpreted to include angles within 15 degrees of 90 degrees and 0 degrees respectively. Further, as used herein the term "substantially in contact" refers to having over a majority of the surface area of a first object being in contact with over a majority of the surface area of a second object.

An electrical communications apparatus includes a support structure having a support heat transfer member. An electrical unit is received within the support structure. The electrical unit includes a module side defining a bore therethrough and arranged to receive an electrical module within the bore. The electrical unit further includes a conduction side adjacent the module side and a unit heat transfer member coupled to the conduction side. The unit heat transfer member and the support heat transfer member are correspondingly tapered to facilitate slidably coupling the unit heat transfer member and the support heat transfer member.

Figure 1:
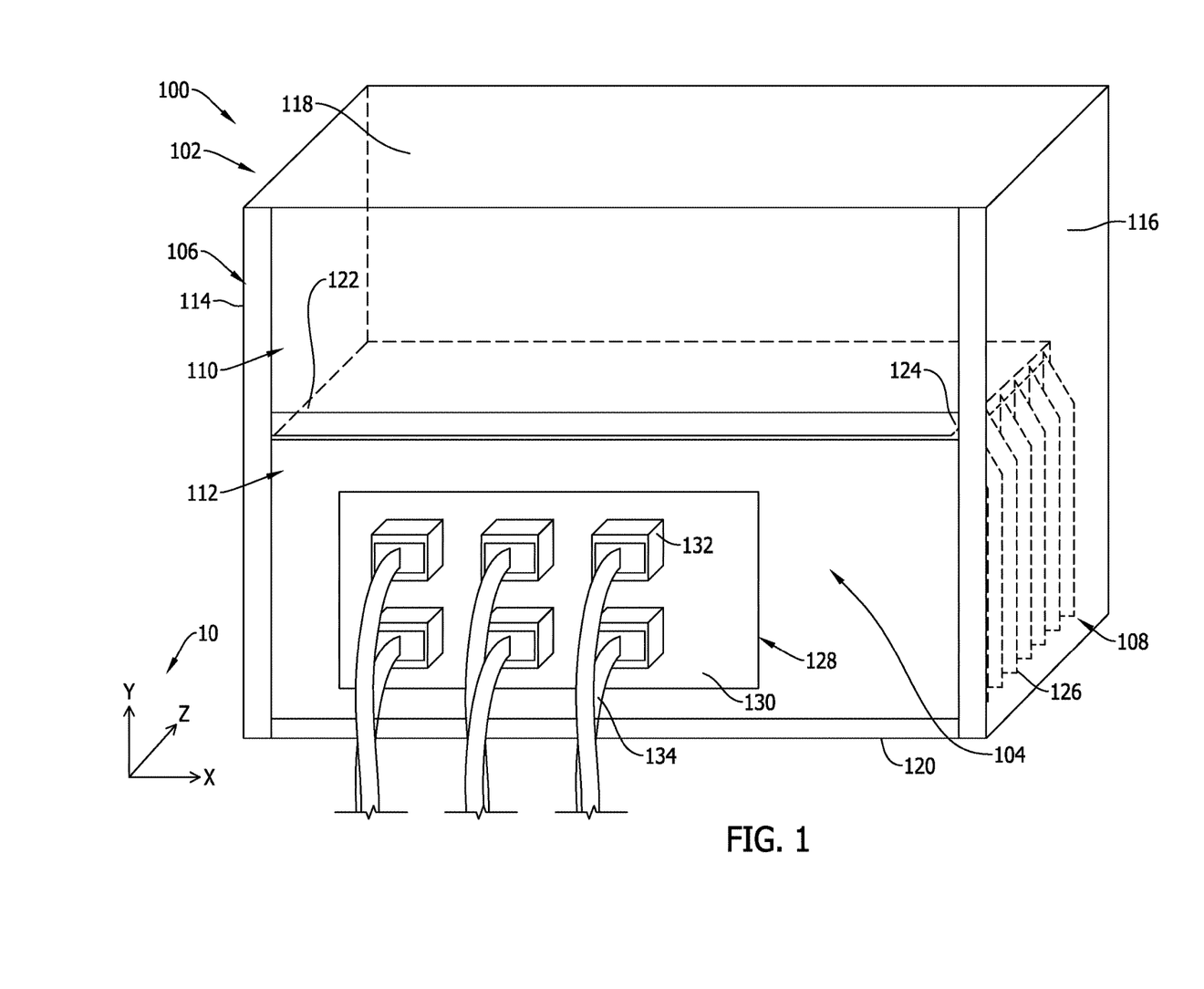
FIG. 1 is a perspective view of an exemplary electrical communications apparatus with portions made transparent to allow for internal viewing of components.

FIG. 1 is a perspective view of an exemplary electrical communications apparatus 100 with portions made transparent to allow for internal viewing of components. A coordinate system 10 includes an X-axis, a Y-axis, and a Z-axis.

In the exemplary embodiment, electrical communications apparatus 100 includes a support structure 102 and an electrical housing 104. Support structure 102 includes a module end 106 and an external connection end 108. In the exemplary embodiment, module end 106 includes an upper face 110 and an open end 112 defined beneath upper face 110. Specifically, open end 112 is sized to receive electrical housing 104 therein. In the exemplary embodiment, support structure 102 further includes a first sidewall 114, a second sidewall 116 opposite first sidewall 114. First sidewall 114 and second sidewall 116 each extend from module end 106 to external connection end 108. Further, in the exemplary embodiment, support structure 102 includes a top surface 118 and a bottom surface 120 transversely oriented to first sidewall 114 and second sidewall 116 and each extending in parallel from module end 106 to external connection end 108. In the exemplary embodiment, support structure 102 is formed of a thermally conductive material. Specifically, support structure 102 is formed of an aluminum alloy. In alternative embodiments, support structure 102 is formed of any material that enables electrical communications apparatus 100 to function as described herein. In the exemplary embodiment, support structure 102 is an aluminum chassis. In alternative embodiments, support structure 102 includes any support structure that enables electrical communications apparatus 100 to function as described herein.

In the exemplary embodiment, electrical housing 104 is sized to be received within support structure 102. Further, electrical housing 104 is removably coupled to support structure 102. Specifically, in the exemplary embodiment, electrical housing 104 is inserted into support structure 102 through open end 112 of support structure 102 between first sidewall 114 and second sidewall 116 along a first direction parallel to the Z-axis. Similarly, electrical housing 104 is removable from support structure 102 in a second direction opposite the first direction and parallel to the Z-axis.

In the exemplary embodiment, electrical housing 104 includes a first sidewall 122 and a second sidewall 124 opposite first sidewall 122. First sidewall 122 and second sidewall 124 of electrical housing 104 are arranged to extend adjacent first sidewall 114 and second sidewall 116 of support structure 102 when electrical housing 104 is received within support structure 102.

In the exemplary embodiment, heat sinks 126 are coupled to first sidewall 122 and second sidewall 124 respectively. Heat sinks 126 are arranged to dissipate heat into a surrounding medium. Specifically, in the exemplary embodiment, heat sinks 126 are arranged to dissipate heat conducted from first sidewall 114 and second sidewall 116 into the support structure 102. In the exemplary embodiment, heat sinks 126 are formed of a thermally conductive material. Specifically, in the exemplary embodiment, heat sinks 126 are formed of an aluminum alloy. In alternative embodiments, heat sinks 126 are formed of a copper alloy. In further alternative embodiments, heat sinks 126 are formed of any material that enables electrical communications apparatus 100 to function as described herein.

In the exemplary embodiment, electrical housing 104 includes an electrical unit 128. Electrical unit 128 includes a module side 130 positioned at module end 106 of support structure 102. Module side 130 defines a plurality of electrical connection bores (not shown) therethrough. In the exemplary embodiment, module side 130 defines six electrical connection bores arranged in two rows and three columns. In alternative embodiments, module side 130 defines only a single electrical connection bore thereon. In further alternative embodiments, module side 130 defines any number of electrical connection bores in any configuration that enables electrical unit 128 to function as described herein.

In the exemplary embodiment, an electrical module 132 is received within each of the electrical connection bores. Specifically, in the exemplary embodiment, electrical communications apparatus 100 includes a plurality of electrical modules 132. Further, in the exemplary embodiment, electrical modules 132 are short form pluggable transceiver devices arranged to be selectively removable from electrical unit 128. In alternative embodiments, electrical modules 132 include any electrical devices that enable electrical communications apparatus 100 to function as described herein. Electrical modules 132 each extend along the Z-axis from an external connection end 108 positioned exterior electrical unit 128 to pin end 194 (shown in FIG. 5) positioned within electrical unit 128. External connection end 108 of electrical modules 132 define a bore thereon to facilitate electrically coupling an external communications line 134. In the exemplary embodiment, external communication lines 134 include an optical fiber cable. In alternative embodiments, external communication lines 134 include any electrical connection units that enable electrical communications apparatus 100 to function as described herein.

Figure 2:
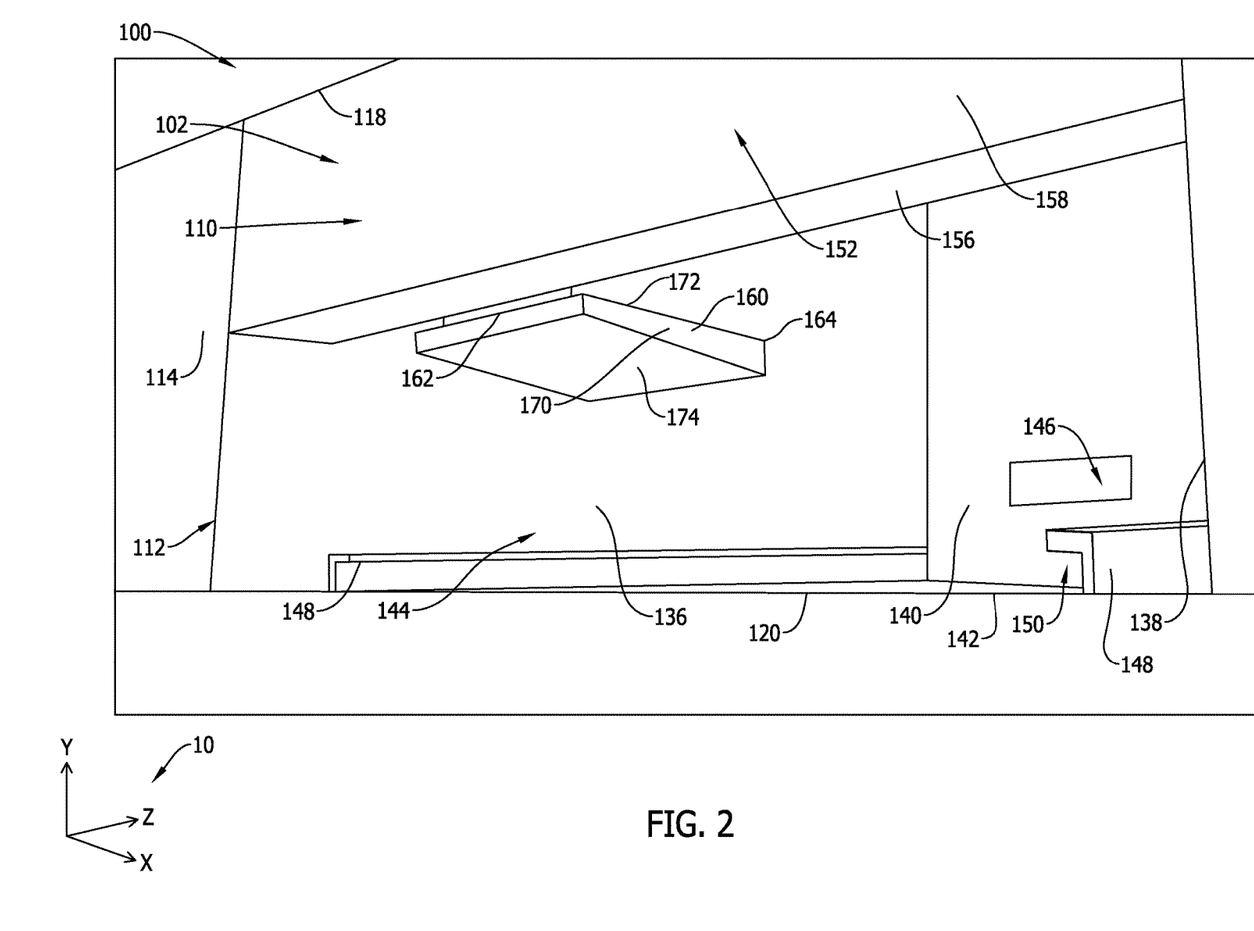
FIG. 2 is a perspective view of the support structure of the electrical communications apparatus shown in FIG. 1.

FIG. 2 is a perspective view of support structure 102 of electrical communications apparatus 100 shown in FIG. 1. In the exemplary embodiment, support structure 102 further includes a first interior sidewall 136 and a second interior sidewall 138 transversely spaced from first interior sidewall 136. First interior sidewall 136 and second interior sidewall 138 each extend from module end 106 to external connection end 108. Support structure 102 further includes a rear wall 140 positioned at external connection end 108 and extending between first interior sidewall 136 and second interior sidewall 138. In alternative embodiments, external connection end 108 of support structure is open to the surrounding medium (e.g. air). A support surface 142 extends between first interior sidewall 136 and second interior sidewall 138. First interior sidewall 136, second interior sidewall 138, rear wall 140, and support surface 142 collectively define an interior space 144 of support structure 102 therebetween. Interior space 144 is accessible through open end 112. Further, in the exemplary embodiment, a connection port 146 is defined within rear wall 140 and is arranged to facilitate electrical connection between electrical modules 132 received within electrical unit 128 and an external electrical device (not shown) when electrical housing 104 is received within support structure 102.

In the exemplary embodiment, guide rails 148 are coupled to support surface 142 and are arranged to guide electrical housing 104 during an insertion of electrical housing 104 within interior space 144. In particular, guide rails 148 extend along the Z-axis from an area adjacent open end 112 to an area adjacent external connection end 108. In the exemplary embodiment, guide rails 148 form a track 150 arranged to receive a corresponding guide element (not shown) coupled respectively to first interior sidewall 136 and second interior sidewall 138 of electrical housing 104.

In the exemplary embodiment, upper face 110 includes a C-bar 152 coupled to top surface 118. In alternative embodiments, C-bar 152 is coupled to bottom surface 120. In further alternative embodiments, C-bar 152 is coupled to support structure 102 in any manner that enables electrical communications apparatus 100 to function as described herein. C-bar 152 includes an upper lip 154 (shown in FIG. 4), a lower lip 156 and spine 158 extending between upper lip 154 and lower lip 156. Upper lip 154 and lower lip 156 extend in parallel from spine 158 substantially along the Z-axis. Further, spine 158 is transversely oriented to upper lip 154 and lower lip 156 and extends substantially along the Y-axis between upper lip 154 and lower lip 156. Thus, as best seen in FIG. 5, in the exemplary embodiment C-bar 152 has a substantially C shaped cross section along the Z-axis. In alternative embodiments, C-bar 152 has any shape that enables C bar to function as described herein. In even further alternative embodiments, C-bar 152 is a heat sink coupled adjacent electrical unit 128. In the exemplary embodiment, C-bar 152 is unitarily formed as one piece. In alternative embodiments, lower lip 156 and upper lip 154 are detachably coupled to spine 158. In further alternative embodiments, upper lip 154, lower lip 156 and spine 158 are coupled in any matter that enables C-bar 152 to function as described herein.

Figure 4:
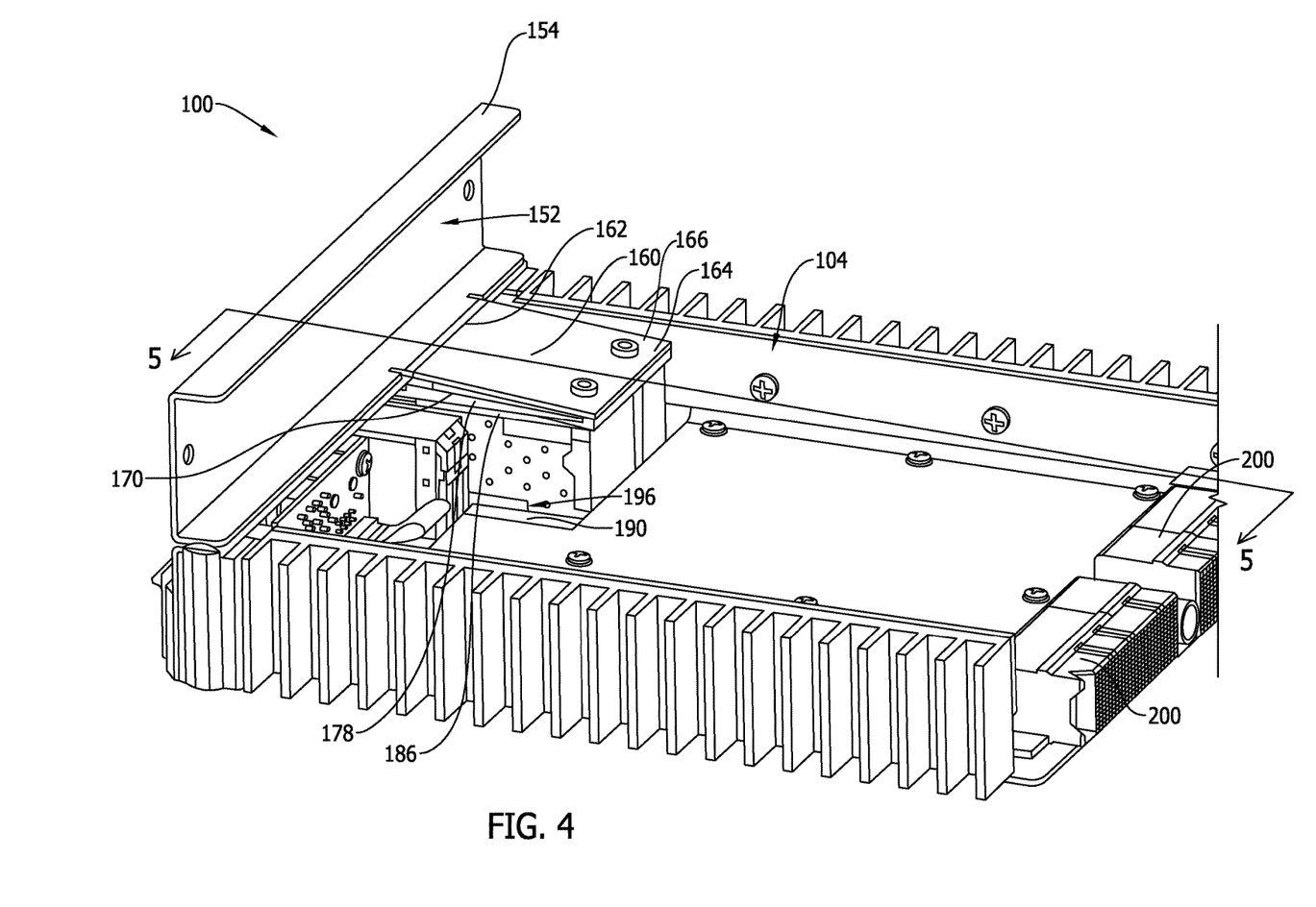
FIG. 4 is a perspective view of the electrical communication system shown in FIG. 1 with portions of the support structure removed to reveal internal construction of the housing.
Figure 5:
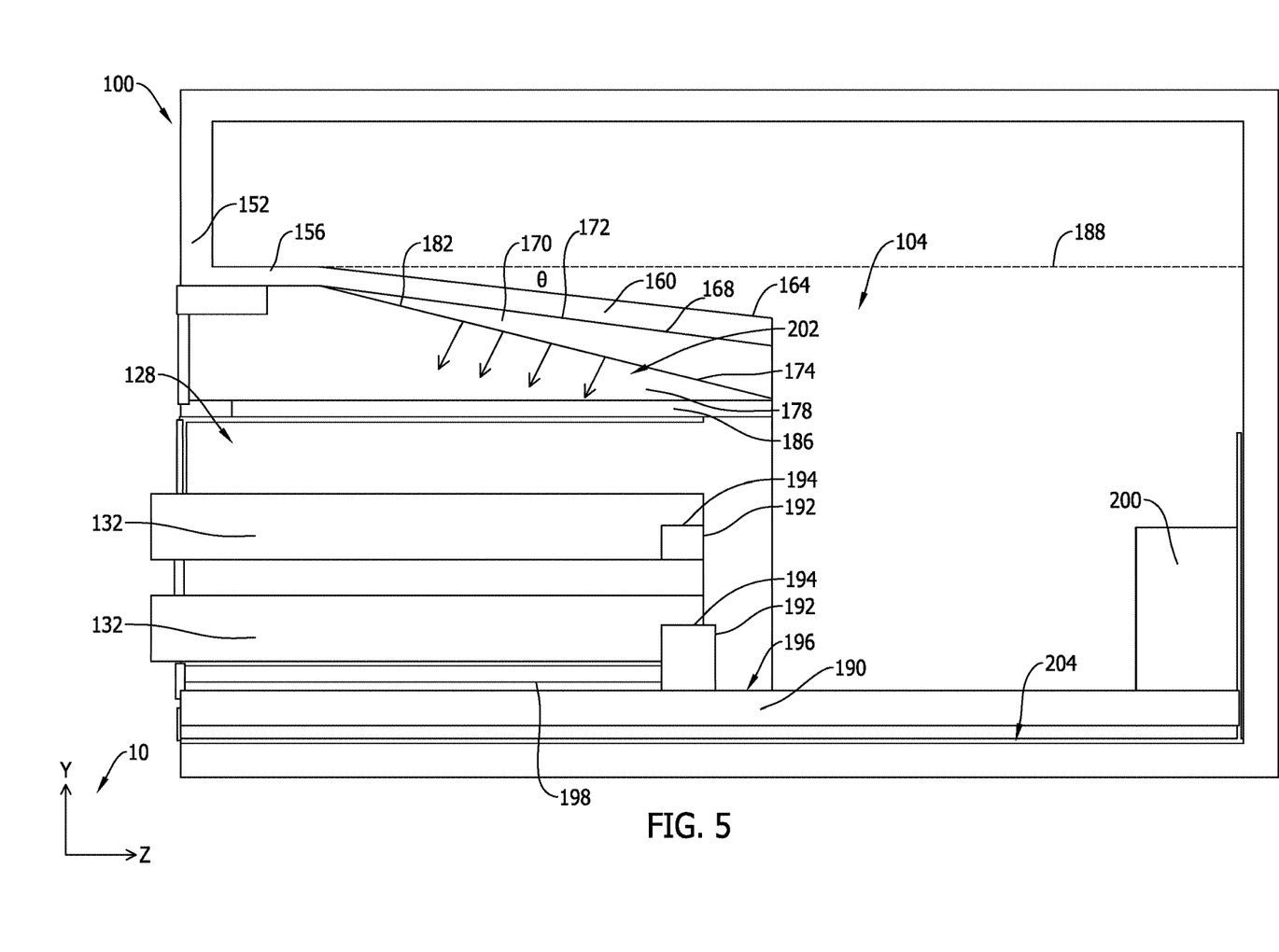
FIG. 5 is a cross sectional view of a portion of the electrical communications apparatus of FIG. 4 taken along the line 5-5.

As best seen in FIG. 4, in the exemplary embodiment, a flange 160 is fixedly coupled to C-bar 152 and extends along the Z axis within interior space 144 between first sidewall 114 and second sidewall 116. Flange 160 includes a coupling end 162 coupled to C-bar 152 extends substantially in the Z-direction to a distal free end 164. In particular, in the exemplary embodiment, flange 160 is coupled to lower lip 156 of C-bar 152. In the exemplary embodiment, flange 160 includes a first surface 166 and a second surface 168. Particularly, in the exemplary embodiment, first surface 166 is an upper flange surface and second surface 168 is a lower flange surface. In alternative embodiments, first surface 166 and second surface 168 may be oriented relative to one another in any manner that enables flange 160 to function as described herein.

Referring again to FIG. 2, in the exemplary embodiment, a support heat transfer member 170 (or alternatively top wedge) is coupled to flange 160. Specifically, top wedge 170 extends within interior space 144 of support structure 102 from an area adjacent C-bar 152 in the Z-direction. In the exemplary embodiment, top wedge 170 is composed of a thermally conductive material. In particular, top wedge 170 is composed of an aluminum alloy. In alternative embodiments, top wedge 170 is composed of a copper alloy. In further alternative embodiments, top wedge 170 is composed of any material that enables electrical communications apparatus 100 to function as described herein.

In the exemplary embodiment, top wedge 170 comprises a support mounting face 172 (shown in FIG. 5) coupled to support structure 102. Specifically, in the exemplary embodiment, support mounting face 172 is coupled to lower flange surface 168 (shown in FIG. 5). In alternative embodiments, a thermal gap pad (not shown) is coupled between support mounting face 172 and lower flange surface 168. Top wedge 170 further includes a support coupling face 174 opposite support mounting face 172. In the exemplary embodiment, support coupling face 174 is polished to facilitate greater thermal conductivity as will be described in greater detail below. In particular, in the exemplary embodiment, top wedge 170 has a tapered height (defined along the Y-axis) such that support coupling face 174 is tapered along the Z-axis. Specifically, in the exemplary embodiment, support coupling face 174 is tapered such that top wedge 170 extends a first height adjacent open end 112 and a second height adjacent flange 160 distal free end 164, such that the second height is greater than the first height. In alternative embodiments, support coupling face 174 is tapered such that the first height is greater than the second height.

Figure 3:
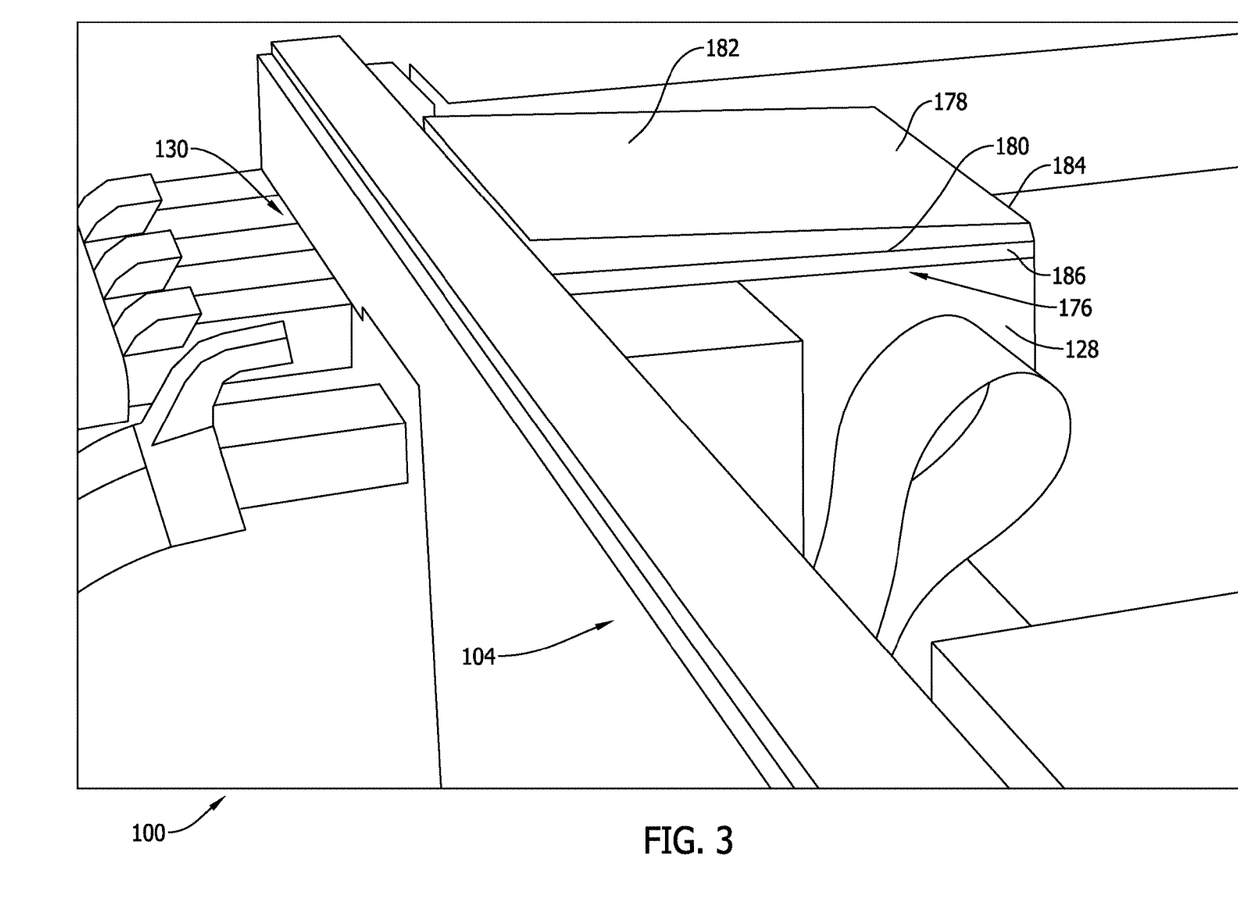
FIG. 3 is a perspective view of the electrical communications apparatus shown in FIG. 1 wherein the housing is partially removed from the support structure.

FIG. 3 is a perspective view of electrical communications apparatus 100 shown in FIG. 1 wherein the electrical housing 104 is partially removed from support structure 102.

In the exemplary embodiment, electrical unit 128 extends within electrical housing 104. In the exemplary embodiment, electrical unit 128 includes a conduction side 176 positioned adjacent module side 130. In the exemplary embodiment, conduction side 176 is transversely oriented to module side 130 and extends in the Z direction from module side 130. Conduction side 176 is arranged to facilitate thermal conduction of heat from electrical unit 128 to support structure 102.

In the exemplary embodiment, a unit heat transfer member 178 (or alternatively bottom wedge) is coupled to conduction side 176 of electrical unit 128. In particular, bottom wedge 178 substantially covers conduction side 176 of electrical unit 128. Bottom wedge 178 is composed of generally the same material as top wedge 170. That is, bottom wedge 178 is composed of a thermally conductive material to facilitate heat transfer from electrical unit 128. Specifically, in the exemplary embodiment, bottom wedge 178 is composed of an aluminum alloy. In alternative embodiments, bottom wedge 178 is composed of any material that enables electrical communications apparatus 100 to function as described herein.

Bottom wedge 178 includes a unit mounting face 180 adjacent electrical unit 128 and a unit coupling face 182 opposite unit mounting face 180. Top wedge 170 has a tapered height (defined along the Y-axis) such that height of unit coupling face 182 tapers in the Z-direction. Specifically, in the exemplary embodiment, bottom wedge 178 is tapered such that bottom wedge 178 extends a first height adjacent module side 130 and a second height adjacent a rear side 184 of electrical unit 128, wherein the first height is greater than the second height. In alternative embodiments, unit coupling face 182 is tapered such that the first height is greater than the second height. In particular, bottom wedge 178 is tapered along unit coupling face 182 and top wedge 170 (shown in FIG. 2) is correspondingly tapered along support coupling face 174 to facilitate slidably coupling bottom wedge 178 to top wedge 170. In other words, top wedge 170 and bottom wedge 178 have substantially equal and opposite tapered heights from one another such that the coupling faces 174, 182 are in full contact with one another along the Z-direction and along the X-direction when electrical housing 104 is fully received within support structure 102 to facilitate maximal heat transfer between said coupling faces 174, 182. Specifically, as used herein, "full contact" refers to having as close to 100% as possible of the surface area of unit coupling face 182 being in contact with as close to 100% as possible of the surface area of support coupling face 174. In alternative embodiments, coupling faces 174, 182 are substantially in contact with one another along the Z-direction and along the X-direction when electrical housing 104 is fully received within support structure 102. Specifically, as used herein, "substantially in contact" refers to having over a majority of the surface area of unit coupling face 182 being in contact with over a majority of the surface area of support coupling face 174. In alternative embodiments, top wedge (shown in FIG. 2) and bottom wedge 178 are tapered in any manner that enables electrical communications apparatus 100 to function as described herein.

In the exemplary embodiment, a first thermal gap pad 186 is coupled to electrical unit 128. Specifically, first thermal gap pad 186 is coupled between bottom wedge 178 and conduction side 176 of electrical unit 128. First thermal gap pad 186 facilitates improved heat transfer between conduction side 176 of electrical unit 128 and bottom wedge 178. For example, in the exemplary embodiment, conduction side 176 is not an entirely smooth surface. Thus, first thermal gap pad 186 facilitates improved thermal conduction of heat from conduction side 176 by flexibly filling air gaps in conduction side 176 when compressed. In the exemplary embodiment, first thermal gap pad 186 is partially composed of a resiliently flexible material and partially composed of a thermally conductive material. Specifically, in the exemplary embodiment, first thermal gap pad 186 is composed of a silicone substantially evenly dispersed with metal oxide particles. In alternative embodiments, first thermal gap pad 186 is composed of any material that enables first thermal gap pad 186 to function as described herein.

In the exemplary embodiment, first thermal gap pad 186 is arranged on conduction side 176 such that compression of first thermal gap pad 186 along the Y-axis substantially fills air gaps in conduction side 176 and compresses the metal oxide particles within first thermal gap pad 186 to contact one another, thereby forming a thermal conduction bridge within first thermal gap pad 186 to facilitate heat conduction through first thermal gap pad 186. Specifically, in the exemplary embodiment, around 30% compression of first thermal gap pad 186 along the Y-axis is sufficient to facilitate heat conduction through first thermal gap pad 186. In alternative embodiments, first thermal gap pad 186 is arranged such that any compression is sufficient to facilitate heat conduction that enables electrical communications apparatus 100 to function as described herein. In further alternative embodiments, bottom wedge 178 is directly coupled to conduction side 176 of electrical unit 128 without a thermal gap pad positioned therebetween. In further alternative embodiments, bottom wedge 178 is unitarily formed with electrical unit 128 such that no thermal gap pad is necessary to facilitate efficient heat conduction into bottom wedge 178.

Figure 6:
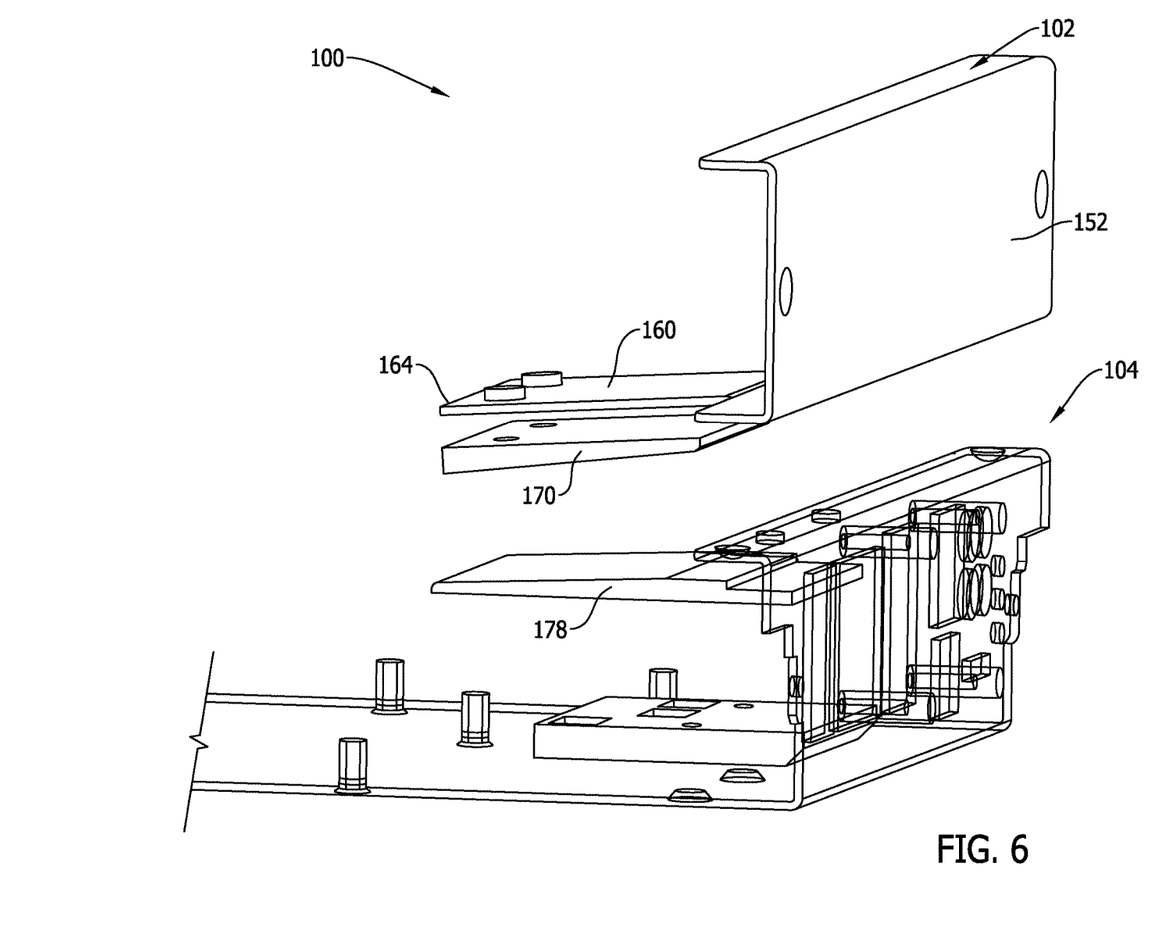
FIG. 6 is an exploded perspective view of the electrical communications apparatus of FIG. 1 with portions of the electrical housing removed and the support structure removed to reveal internal construction.

FIG. 4 is a perspective view of electrical communications apparatus 100 shown in FIG. 1 with portions of support structure 102 removed to reveal internal construction of electrical housing 104. FIG. 5 is a cross sectional view of a portion of electrical communications apparatus 100 of FIG. 4 taken along the line 5-5. FIG. 6 is an exploded perspective view of electrical communications apparatus 100 of FIG. 1 with portions of electrical housing 104 removed and support structure 102 removed to reveal internal construction.

Referring to FIG. 5, in the exemplary embodiment, an axis 188 is shown extending from lower lip 156 of C-bar 152 in the Z direction. In particular, in the exemplary embodiment flange 160 is oriented at an acute angle θ to axis. In the exemplary embodiment, flange 160 is oriented at such an angle that flange 160 generally extends partially downward towards distal free end 164. Further, in the exemplary embodiment, flange 160 is resiliently biased at angle θ. Thus, when electrical housing 104 is inserted into support structure 102, top wedge 170 frictionally engages bottom wedge 178 at respective coupling faces 174, 182, and further compressing first thermal gap pad 186 to facilitate efficient thermal conduction between electrical unit 128 and support structure 102. In particular, in the exemplary embodiment, substantially all surface area of coupling faces 174, 182 contact one another to maximize thermal conduction between bottom wedge 178 and top wedge 170.

In the exemplary embodiment, electrical housing 104 is locked into support structure 102 via a locking mechanism (not shown) such that electrical housing 104 resists movement in the Z-direction. Force arrows 202 show translation of a downward force applied by flange 160 through top wedge 170, bottom wedge 178 and into first thermal gap pad 186. In particular, downward force is applied on electrical unit 128 by top wedge 170 in a direction normal to coupling face 174 of top wedge 170. Additionally, frictional engagement between top wedge 170 and bottom wedge 178 facilitates downward force translation through between top wedge 170 and bottom wedge 178. As shown in FIGS. 4 and 5, translation of downward force applied by top wedge 170 compresses first thermal gap pad 186 approximately 30%. In other words, in the exemplary embodiment, first thermal gap pad 186 has a height 70% of its total resting height when electrical unit 128 is removed from electrical housing 104. Compression of first thermal gap pad 186 enables metal oxide particles within first thermal gap pad 186 to come into contact with one another to permit thermal conduction through first thermal gap pad 186.

In the exemplary embodiment, electrical housing 104 includes a carrier 190 spanning a lower surface 204 of electrical housing 104. Specifically, in the exemplary embodiment, carrier 190 is a printed circuit board. Further, electrical unit 128 includes a plurality of electrical connectors 192 positioned within each bore of electrical unit 128. Electrical connectors 192 are arranged in electrical communication with electrical elements of printed circuit board 190 such that when electrical modules 132 are inserted into electrical unit 128, a pin end 194 of each electrical module is aligned to form an electrical connection with electrical connectors 192.

In the exemplary embodiment, electrical unit 128 further includes a connection side 196 transversely oriented to module side 130 and positioned adjacent printed circuit board 190. Connection side 196 is arranged to facilitate electrical communication between electrical modules 132 and printed circuit board 190. In the exemplary embodiment, connection side 196 is composed of a thermally conductive material to permit heat transfer from electrical modules 132 positioned within electrical unit 128 to connection side 196. Specifically, connection side 196 is composed of an aluminum alloy. In alternative embodiments, connection side 196 is composed of any material that enables electrical communications apparatus 100 to function as described herein. Further, in the exemplary embodiment, a second thermal gap pad 198 is positioned between connection side 196 and printed circuit board 190 to facilitate heat transfer between connection side 196 of electrical unit 128 and support structure 102 through printed circuit board 190. For example, as will be described in greater detail with respect to FIGS. 7 and 8, in the exemplary embodiment, printed circuit board 190 includes a conductive weave extending therethrough and arranged to contact second thermal gap pad 198 and support structure 102 to facilitate conductive heat transfer through printed circuit board 190.

In the exemplary embodiment, electrical housing 104 includes external connectors 200 positioned adjacent external connection end 108 of support structure 102 when electrical housing 104 is received within support structure 102. External connectors 200 are electrically coupled to printed circuit board 190 such that electrical modules 132 are operable to be in electrical communication with external connectors 200 through a conductive pathway (not shown) extending through printed circuit board 190.

Electrical housing 104 is substantially composed of a thermally conductive material substantially similar to top wedge 170 and bottom wedge 178. Further, thermally conductive regions of electrical housing 104 are arranged to substantially contact surface regions of electrical modules 132 when electrical modules 132 are received within electrical housing 104. Specifically, in the exemplary embodiment, electrical housing 104 is substantially composed of an aluminum alloy. In alternative embodiments, electrical housing 104 is composed of any thermally conductive material that enables electrical communications apparatus 100 to function as described herein.

Figure 7:
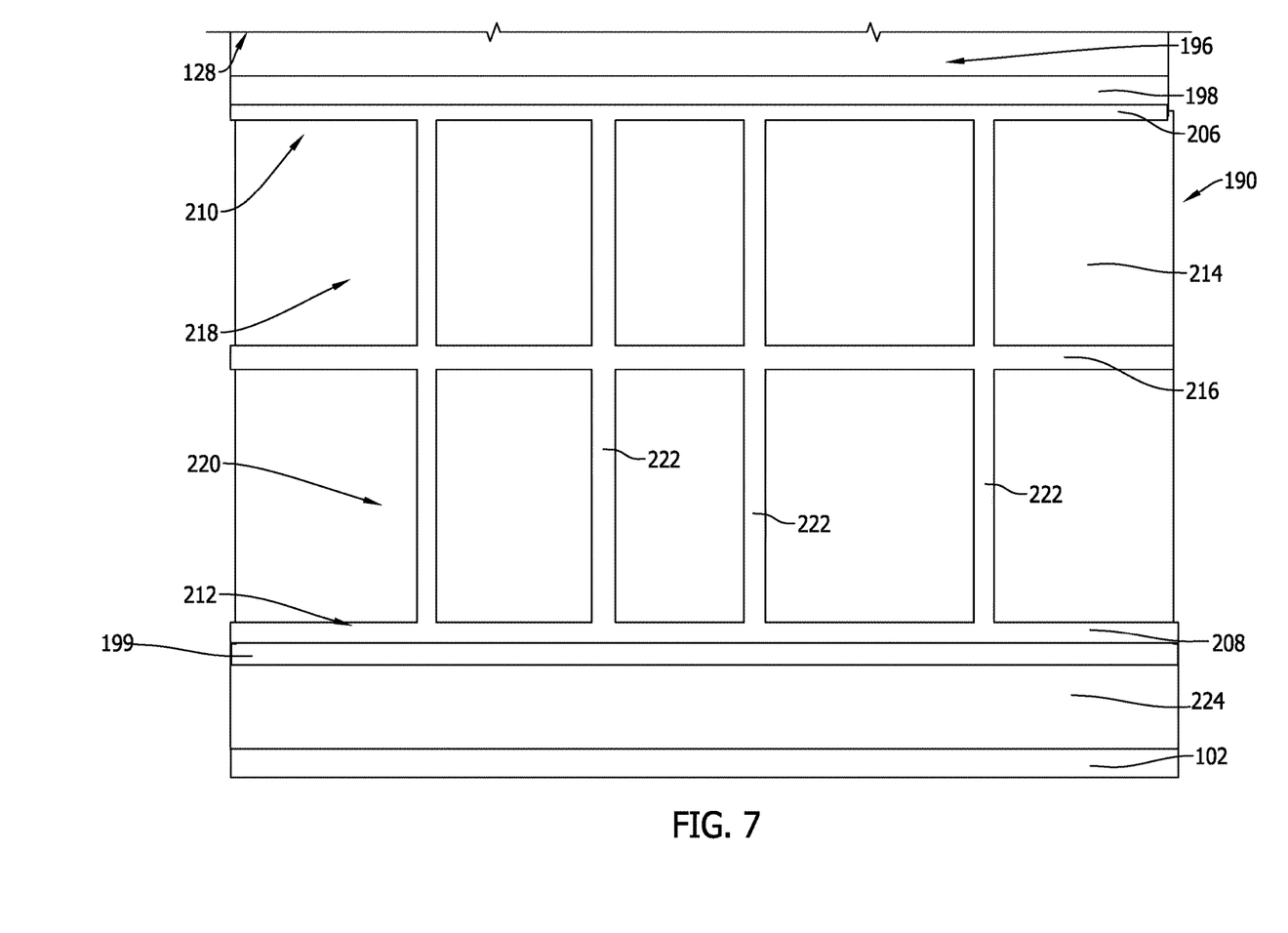
FIG. 7 is a schematic side view of a printed circuit board for use in the exemplary electrical communications apparatus.

FIG. 7 is a schematic side view of printed circuit board 190 for use in the exemplary electrical communications apparatus.

In the exemplary embodiment, connection side 196 of electrical unit 128 is coupled to second thermal gap pad 198. In the exemplary embodiment, second thermal gap pad 198 has substantially the same material composition as first thermal gap pad 186 (shown in FIG. 5). That is, in the exemplary embodiment, second thermal gap pad 198 is partially composed of a resiliently flexible material and partially composed of a thermally conductive material. Specifically, second thermal gap pad 198 is composed of a silicone substantially evenly dispersed with metal oxide particles. In the exemplary embodiment, when electrical housing 104 is received within support structure 102, downward force (shown in FIG. 5) is translated through electrical unit 128 to compress second thermal gap pad 198 into a compressed state. In particular, in the exemplary embodiment, second thermal gap pad 198 is compressed approximately 30% in the Y-direction to facilitate thermal conduction via metal oxide particles within second thermal gap pad 198.

In the exemplary embodiment, printed circuit board 190 includes a first thermal layer 206 coupled to second thermal gap pad 198 and arranged to thermally conduct heat from electrical unit 128 through second thermal gap pad 198 when second thermal gap pad 198 is in a compression state.

In addition, in the exemplary embodiment, printed circuit board 190 includes a second thermal layer 208 vertically displaced from first thermal layer 206. In the exemplary embodiment, first thermal layer 206 and second thermal layer 208 are copper plates. First thermal layer 206 and second thermal layer 208 respectively define an uppermost 210 and lowermost region 212 of printed circuit board 190. In alternative embodiments, first thermal layer 206 and second thermal layer 208 are composed of any thermally conductive material that enables electrical communications apparatus 100 to function as described herein.

In the exemplary embodiment, printed circuit board 190 is predominantly composed of a non-thermally conductive circuit board material 214. In the exemplary embodiment, circuit board material 214 is a dielectric material. In particular, circuit board material 214 is fiberglass. Circuit board material 214 is respectively coupled to first thermal layer 206 and second thermal layer 208. In alternative embodiments, circuit board material 214 includes any material that enables electrical communications apparatus 100 to function as described herein.

In the exemplary embodiment, printed circuit board 190 includes an intermediary conductive layer 216 positioned within circuit board material 214. Intermediary layer 216 divides printed circuit board material 214 into a first layer 218, positioned in above intermediary layer 216 in the exemplary embodiment, and a second layer 220 positioned below intermediary layer 216. In the exemplary embodiment, intermediary layer 216 is formed of copper. In alternative embodiments, intermediary layer 216 is formed of any material that enables printed circuit board 190 to function as described herein. In the exemplary embodiment, intermediary layer 216 is a grounding layer. In alternative embodiments, printed circuit board 190 does not include an intermediary layer. In further alternative embodiments, printed circuit board 190 includes any number of intermediary layers that enables electrical communications apparatus 100 to function as described herein.

In the exemplary embodiment, printed circuit board 190 defines a plurality of channels 222 extending within printed circuit board material 214 between first thermal layer 206 and second thermal layer 208. In particular, in the exemplary embodiment, the plurality of channels 222 are vertical interconnect accesses (or alternatively VIAs). In the exemplary embodiment, VIAs 222 include a tubular conductive plating lining a circumference defined by VIAs 222 and positioned within through-holes (not shown) defined in printed circuit board 190. Through holes are defined to extend unbroken vertically between first thermal layer 206 and second thermal layer 208. In alternative embodiments, blind VIAs 222 are defined to extend through printed circuit board material 214 in horizontally displaced segments while maintaining thermal communication between segmented blinds through intermediary layers. In further alternative embodiments, printed circuit board 190 defines both blind VIAs and through hole VIAs. In even further alternative embodiments, VIAs 222 are defined in any arrangement that enables electrical communications apparatus 100 to function as described herein.

As shown in FIG. 7, in the exemplary embodiment, second thermal layer 208 is coupled to a third thermal gap pad 199. In the exemplary embodiment, third thermal gap pad 199 has substantially the same material composition as first thermal gap pad 186 (shown in FIG. 5). That is, in the exemplary embodiment, third thermal gap pad 199 is partially composed of a resiliently flexible material and partially composed of a thermally conductive material. Specifically, third thermal gap pad 199 is composed of a silicone substantially evenly dispersed with metal oxide particles. In the exemplary embodiment, when electrical housing 104 is received within support structure 102, downward force (shown in FIG. 5) is translated through electrical unit 128 to compress second thermal gap pad 198 into a compressed state. Downward force (shown in FIG. 5) is further translated through printed circuit board 190 to compress third thermal gap pad 199 into a compressed state. In particular, in the exemplary embodiment, third thermal gap pad 199 is compressed approximately 30% in the Y-direction to facilitate thermal conduction via metal oxide particles within third thermal gap pad 199. In alternative embodiments, second thermal layer 208 is directly coupled to any material that facilitates conductive heat transfer between second thermal layer 208 and support structure 102 as described herein.

In the exemplary embodiment, third thermal gap pad 199 is further coupled to a thermal mount 224. Thermal mount 224 is further coupled to support structure 102. Thermal mount 224 is composed of a thermally conductive material arranged to approximately uniformly contact third thermal gap pad 199 in order to facilitate thermal conduction between third thermal gap pad 199 and thermal mount 224. Specifically, in the exemplary embodiment, thermal mount 224 is composed of aluminum. In alternative embodiments, thermal mount 224 is composed of any thermally conductive material that enables electrical communications apparatus 100 to function as described herein.

Referring to FIGS. 5 and 7, during operation of electrical communications apparatus 100 heat generated by electrical modules 132 is thermally conducted into electrical housing 104. Thus, in the exemplary embodiment, electrical communications apparatus 100 provides a thermal conduction path from electrical modules 132 to support structure 102 through top wedge 170. Further, electrical communications apparatus 100 provides a thermal conduction path from electrical modules 132 to support structure 102 through first thermal layer 206, VIAs, and second thermal layer 208 respectively. That is, in the exemplary embodiment, electrical communications apparatus 100 provides a thermal conduction path to conduct heat from the conduction side 176 of electrical unit 128 and connection side 196 of electrical unit 128. In alternative embodiments, electrical communications apparatus 100 provides only a thermal conduction path to conduct heat from conduction side 176 of electrical unit 128.

Figure 8:
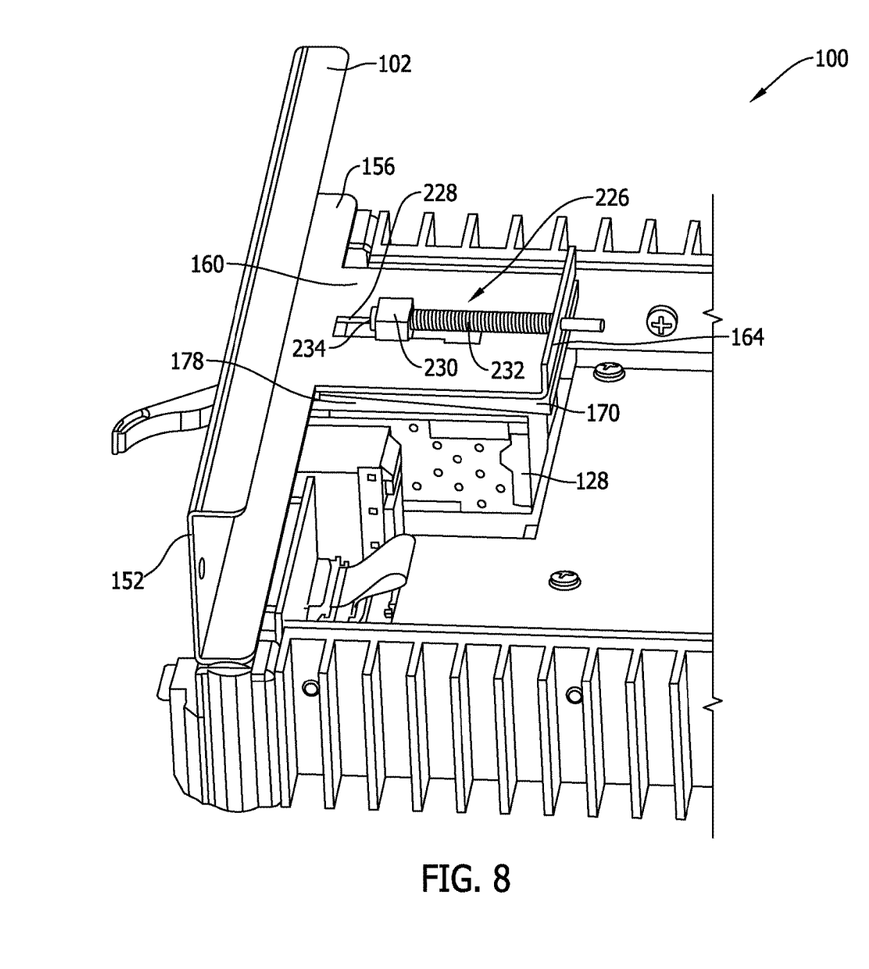
FIG. 8 is a perspective view of an alternative support structure for use in the electrical communications apparatus.

FIG. 8 is a perspective view of an alternative support structure 102 for use in electrical communications apparatus 100. In particular, in the exemplary embodiment, electrical communications apparatus 100 includes an engagement mechanism 226 coupled to flange 160 and arranged to selectively position top wedge 170 relative to bottom wedge 178. In the exemplary embodiment, flange 160 is oriented to extend substantially parallel with lower lip 156 of C-bar 152. In the exemplary embodiment, flange 160 defines a flange track 228 extending therethrough. A region of top wedge 230 extends generally through flange track 228 and defines a top wedge bore for receiving engagement mechanism 226. Engagement mechanism 226 further extends through an additional bore defined in distal free end 164 of flange 160. Thus, in the exemplary embodiment, when electrical unit 128 is received within electrical support structure 102, rotation of engagement mechanism 226 in a first direction drives a lateral movement of top wedge 170 along track 150 in the Z direction away from contacting bottom wedge 178. Further, rotation of engagement mechanism 226 in a second direction opposite the first direction drives a lateral movement of top wedge 170 along track 150 in the Z direction towards contacting bottom wedge 178.

In the exemplary embodiment, engagement mechanism 226 includes a screw 232 coupled to a thumb nut 234. In the exemplary embodiment, thumb nut 234 is coupled to region of top wedge 230 and positioned adjacent top wedge 170. In alternative embodiments, thumb nut 234 extends through C-bar 152 such that thumb nut 234 is externally accessible by an operator. In further alternative embodiments, screw 232 includes a biasing member (not shown) arranged to bias screw 232 towards a lateral positioning of top wedge 170. In further alternative embodiments, engagement mechanism 226 comprises any engagement mechanism 226 that enables electrical communications apparatus 100 to function as described herein.

In the exemplary embodiment, insertion of electrical housing 104 within support structure 102 is accomplished without frictionally engaging top wedge 170 and bottom wedge 178. That is, before insertion of electrical housing 104, engagement mechanism 226 is in a first position (not shown) defined by top wedge 170 being rearwardly positioned along the Z-axis such that when electrical unit 128 is received within support structure 102, top wedge 170 does not contact bottom wedge 178. Thus, when electrical housing 104 is inserted into support structure 102, top wedge 170 is laterally displaced from bottom wedge 178. An operator, then rotates engagement mechanism 226 in the second direction to drive lateral movement of top wedge 170 along track 150 in the Z direction towards contacting bottom wedge 178. In particular, engagement mechanism 226 is rotated such that top wedge 170 contacts and applies a compression force on bottom wedge 178. As a result, in the exemplary embodiment, compression applied by top wedge 170 is selectively variable by an operator. In alternative embodiments, compression force is applied to bottom wedge 178 in any manner that enables electrical communications apparatus 100 to function as described herein. Similarly, in the exemplary embodiment, when electrical housing 104 is removed from support structure 102, an operator rotates engagement mechanism 226 in the first direction to drive lateral movement of top wedge 170 along track 150 in the Z direction away from contacting bottom wedge 178. In alternative embodiments, compression force is applied to bottom wedge 178 in any manner that enables electrical communications apparatus 100 to function as described herein.

An exemplary technical effect of the methods, systems, and apparatus described herein includes at least one of: (a) improved cooling of electrical modules; (b) improved cooling of electrical units arranged to receive electrical units in a stacked configuration; (c) improved data throughput capabilities for electrical units; and (d) potential to be used with electrical housings having varied form factor through use of a fastening mechanism.

Exemplary embodiments of systems and methods for passive cooling of components within electrical devices are described above in detail. The systems and methods are not limited to the specific embodiments described herein but, rather, components of the electrical communications apparatuses and/or operations of the methods may be utilized independently and separately from other components and/or operations described herein. Further, the described components and/or operations may also be defined in, or used in combination with, other systems, methods, and/or devices, and are not limited to practice with only the electrical communications systems and apparatuses described herein.

The order of execution or performance of the operations in the embodiments of the disclosure illustrated and described herein is not essential, unless otherwise specified. That is, the operations may be performed in any order, unless otherwise specified, and embodiments of the disclosure may include additional or fewer operations than those disclosed herein. For example, it is contemplated that executing or performing a particular operation before, contemporaneously with, or after another operation is within the scope of aspects of the disclosure.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electrical communications apparatus comprising:
a support structure comprising a support heat transfer member; and
an electrical unit received within said support structure, said electrical unit comprising:
a module side defining a bore therethrough and arranged to receive an electrical module within the bore;
a conduction side adjacent said module side; and
a unit heat transfer member coupled to said conduction side, wherein said unit heat transfer member and said support heat transfer member are correspondingly tapered to facilitate slidably coupling said unit heat transfer member and said support heat transfer member.

2. The electrical communications apparatus of claim 1, wherein said support structure further comprises a flange transversely spaced from said conduction side of said electrical unit, wherein said support heat transfer member is coupled to said flange.

3. The electrical communications apparatus of claim 2, wherein said flange is oriented at an angle to said conduction side.

4. The electrical communications apparatus of claim 2, wherein said support structure further comprises an engagement mechanism coupled to said flange, said engagement mechanism operable to selectively engage said unit heat transfer member with said support heat transfer member.

5. The electrical communications apparatus of claim 1, wherein said unit heat transfer member further comprises a unit coupling face, wherein said support heat transfer member further comprises a support coupling face, wherein said unit heat transfer member and said support heat transfer member are coupled such that said unit coupling face and said support coupling face are substantially in contact with one another to facilitate heat transfer between said unit coupling face and said support coupling face.

6. The electrical communications apparatus of claim 5, wherein said electrical unit further comprises a rear side opposite said module side, wherein said unit heat transfer member extends along said conduction side between said module side and said rear side.

7. The electrical communications apparatus of claim 6, wherein said unit heat transfer member is tapered along said unit coupling face from a first height adjacent said module side to a second height adjacent said rear side, wherein the first height is greater than the second height.

8. The electrical communications apparatus of claim 1, wherein said electrical unit further comprises a connection side transversely oriented to said module side.

9. The electrical communications apparatus of claim 8 further comprising a carrier electrically coupled to said electrical unit, said connection side adjacent said carrier.

10. The electrical communications apparatus of claim 9, wherein said carrier comprises a first thermal layer, a second thermal layer, and a plurality of channels extending between said first thermal layer and said second thermal layer.

11. The electrical communications apparatus of claim 1 further comprising a heat sink coupled to said electrical unit and arranged to dissipate heat into a surrounding medium.

12. The electrical communications apparatus of claim 1 further comprising a first thermal gap pad coupled between said unit heat transfer member and said conduction side.

13. An electrical unit for use in an electrical communications apparatus, said electrical unit comprising:
a module side defining a bore therethrough and arranged to receive an electrical module within the bore;
a conduction side adjacent said module side; and
a unit heat transfer member coupled to said conduction side, wherein said unit heat transfer member is tapered to facilitate slidably coupling said unit heat transfer member to a correspondingly tapered support heat transfer member of the electrical communications apparatus.

14. The electrical unit of claim 13, wherein said electrical unit further comprises a rear side opposite said module side, wherein said unit heat transfer member extends along said conduction side between said module side and said rear side.

15. The electrical unit of claim 14, wherein said unit heat transfer member further comprises a unit coupling face, wherein said unit heat transfer member is tapered along said unit coupling face from a first height adjacent said module side to a second height adjacent said rear side, wherein the first height is greater than the second height.

16. The electrical unit of claim 13 further comprising a heat sink coupled to said electrical unit and arranged to dissipate heat into a surrounding medium.

17. The electrical unit of claim 13 further comprising a first thermal gap pad coupled between said unit heat transfer member and said conduction side.

18. A method of using an electrical communications apparatus comprising:
inserting an electrical unit into a support structure, the support structure including a support heat transfer member; and
electrically coupling the electrical unit to a carrier, the electrical unit including:
a module side defining a bore therethrough and arranged to receive an electrical module within the bore;
a conduction side adjacent the module side; and
a unit heat transfer member coupled to the conduction side, wherein the unit heat transfer member and the support heat transfer member are correspondingly tapered to facilitate slidably coupling the unit heat transfer member and the support heat transfer member.

19. The method of claim 18 further comprising controlling an engagement mechanism to selectively engage the unit heat transfer member with the support heat transfer member.

20. The method of claim 18 further comprising compressing a first thermal gap pad coupled between the conduction side and the unit heat transfer member to facilitate thermal conduction therethrough.

\* \* \* \* \*